United States Patent
Kozyrev

(10) Patent No.: US 9,627,730 B1
(45) Date of Patent: Apr. 18, 2017

(54) NON-MAGNETIC FREQUENCY SELECTIVE LIMITERS AND SIGNAL-TO-NOISE ENHANCERS

(71) Applicant: Alexander B. Kozyrev, Madison, WI (US)

(72) Inventor: Alexander B. Kozyrev, Madison, WI (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 34 days.

(21) Appl. No.: 14/720,164

(22) Filed: May 22, 2015

(51) Int. Cl.
| | |
|---|---|
| H03G 11/00 | (2006.01) |
| H01P 1/20 | (2006.01) |
| H03H 7/01 | (2006.01) |
| H03H 7/06 | (2006.01) |
| H03H 11/00 | (2006.01) |

(52) U.S. Cl.
CPC ............. *H01P 1/20* (2013.01); *H03H 7/0138* (2013.01); *H03H 7/0161* (2013.01); *H03H 7/06* (2013.01); *H03H 7/1741* (2013.01); *H03H 11/00* (2013.01)

(58) Field of Classification Search
CPC . G01S 19/21; H01P 1/227; H01P 9/00; H03G 11/02; H03G 11/006; H03G 9/00; H03H 2/001; H03H 7/0107
USPC ................................................ 333/17.2, 172
See application file for complete search history.

(56) References Cited

U.S. PATENT DOCUMENTS

| | | | | |
|---|---|---|---|---|
| 4,396,893 A | * | 8/1983 | Edson | H03G 9/00 327/325 |
| 5,323,126 A | * | 6/1994 | Spezio | H03G 11/006 333/109 |
| 5,523,725 A | * | 6/1996 | Ishikawa | H03H 2/001 333/116 |
| 7,557,672 B1 | * | 7/2009 | Adam | G01S 19/21 327/309 |
| 8,018,300 B2 | * | 9/2011 | Chen | H03H 7/0115 333/172 |

OTHER PUBLICATIONS

Ho et al., "Passive Phase-Distortionless Parametric Limiting with Varactor Diodes", Nov. 1961, IRE Transactions on Microwave Theory and Techniques, pp. 459-472.*

(Continued)

*Primary Examiner* — Dean Takaoka
*Assistant Examiner* — Alan Wong
(74) *Attorney, Agent, or Firm* — Donna P. Suchy; Daniel M. Barbieri

(57) ABSTRACT

A non-magnetic material frequency selective limiter circuit has first and second resonators and a non-linear coupling component. The first resonator oscillates at a fundamental frequency. The second resonator oscillates at one half of the fundamental frequency. The non-linear coupling component non-linearly and parametrically couples the first resonator and the second resonator. The first resonator, second resonator and the non-linear coupling component are arranged so as to reduce the amplitude of an output signal for an input signal of frequency $\omega$ when an input signal amplitude is above a voltage threshold value, by converting part of the input signal to a signal at the frequency $\omega/2$. The first resonator, second resonator and the non-linear coupling component are formed of non-magnetic materials.

15 Claims, 15 Drawing Sheets

(56) References Cited

OTHER PUBLICATIONS

Chien, "Frequency-Selective Limiter and Its Appication in a Filter Bank Receiver", Apr. 1973, NTIS.*
Orth, "Frequency-Selective Limiters and Their Application", Jun. 1968, IEEE Transactions on Electromagnetic Compatibility vol. EMC-10, No. 2, p. 273-283.*
John D. Adam, "Mitigate the interference", IEEE Microwave Magazine, Sep./Oct. 2014, pp. 45-56.
Attílio J. Giarola, "A review of the theory, characteristics, and operation of frequency selective limiters", Proceedings of the IEEE, Oct. 1979, pp. 1380-1396, vol. 67, No. 10.

* cited by examiner

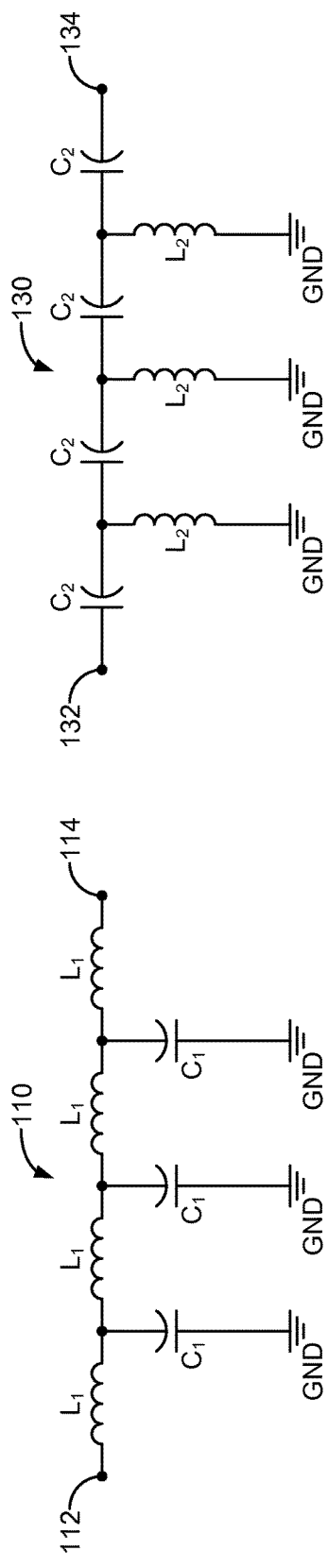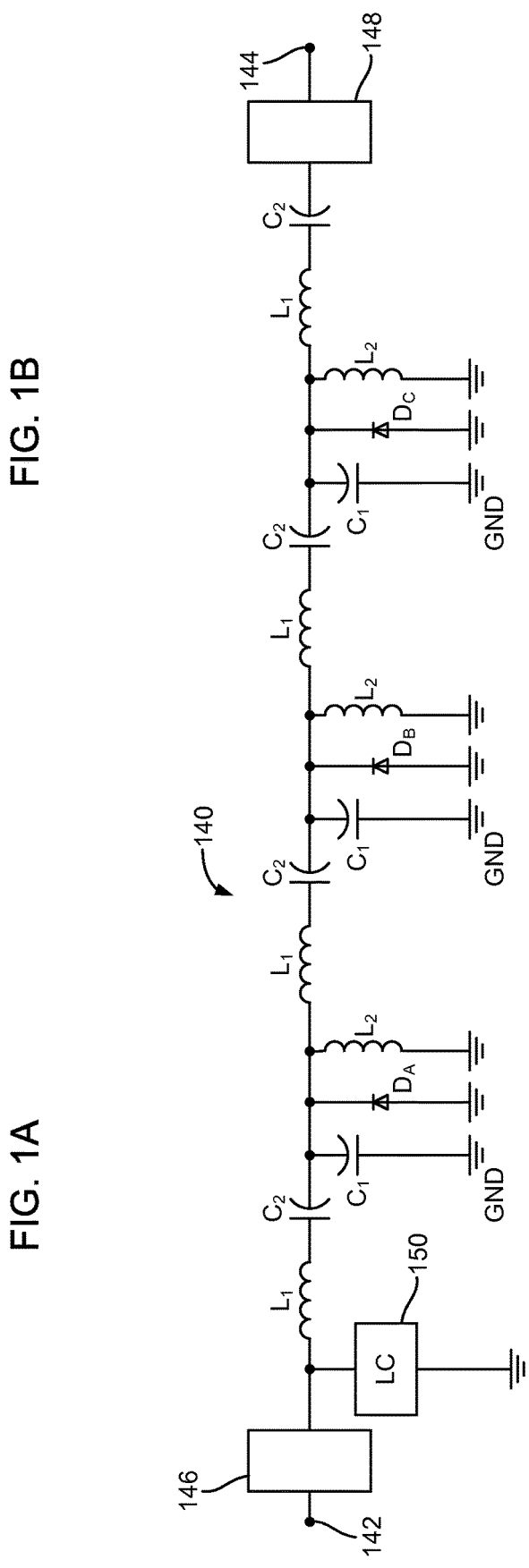

NON-MAGNETIC FREQUENCY SELECTIVE LIMITERS AND SIGNAL-TO-NOISE ENHANCERS

BACKGROUND

The present invention relates generally to the field of frequency selective limiter circuits and signal-to-noise enhancers.

Frequency selective limiters (FSLs) are two-port devices that can selectively attenuate undesired interference, thus improving the reception of desired signals. For example, see [A. J. Giarola, Proc. IEEE, vol. 67, no. 10, October 1979 "A review of the theory, characteristics, and operation of frequency selective limiters"].

FIGS. 13A-13D illustrate the operation of a typical FSL (see [J. D. Adam, IEEE Microwave Mag., September/October 2014, p. 45, "Mitigate the interference"]). FIG. 13A illustrates the transfer function $G_0$ of an FSL at low powers where the input power of various frequency components of a signal is below a threshold value for each frequency component. In this case the FSL acts as a band pass filter passing the frequency components. FIG. 13B illustrates the input power of various frequency components where two of the components at frequencies $\omega_2$ and $\omega_3$ have a power above the threshold value. FIG. 13C illustrates the transfer function $G_0$ of an FSL for the input powers of FIG. 13B, where the FSL limits the output powers of the FSL for the components at frequencies $\omega_2$ and $\omega_3$. FIG. 13D illustrates the output power of the FSL for the input powers of FIG. 13B, where the FSL limits the output powers of the FSL for the components at frequencies $\omega_2$ and $\omega_3$ to be at most a threshold value. An ideal FSL should be capable of limiting the power of individual frequency components which are above a certain threshold level, without mutual interference or without affecting any other frequency components.

Known FSLs are based on nonlinear "large signal" properties of ferrites or similar magnetic materials (see, for example, [J. D. Adam, IEEE Microwave Mag., September/October 2014, p. 45, "Mitigate the interference"]). The physical mechanism that is responsible for frequency selective power limiting in magnetic materials is based on parametric coupling between the uniform magnetic spin precession (magnetostatic wave) at a signal frequency $\omega$ with spin waves at one half of the signal frequency, i.e., at $\omega/2$.

Magnetic material components, however, suffer from major drawbacks inherent to magnetic materials in general. Such magnetic materials are bulky, heavy, incompatible with integrated circuit technologies, sensitive to temperature detuning, require permanent magnetic bias field, and are good only in a certain frequency range (due to fixed frequency of gyromagnetic precession). Nonlinear magnetic materials are also extremely expensive since the quality requirements are higher than in the case of linear materials.

SUMMARY OF THE INVENTION

According to one embodiment, there is provided a non-magnetic material frequency selective limiter circuit that exhibits functionality of the magnetic frequency selective limiter. The circuit comprises: an input configured to receive an input signal; an output configured to output an output signal; a first resonator oscillating at a fundamental frequency to pass a signal having a frequency $\omega$ for an input signal having the frequency $\omega$; a second resonator oscillating at one half of the fundamental frequency to pass a signal having a frequency $\omega/2$ for an input signal having the frequency $\omega$; a non-linear coupling component non-linearly an parametrically coupling the first resonator and the second resonator, wherein the first resonator, second resonator and the non-linear coupling component are arranged so as to reduce the amplitude of an output signal for an input signal of frequency $\omega$ when an input signal amplitude is above a voltage threshold value, by converting part of the input signal to a signal at the frequency $\omega/2$, wherein the first resonator, second resonator and the non-linear coupling component are formed of non-magnetic materials.

According to one aspect of the embodiment, the first and second resonators are arranged to cross each other.

According to another aspect of the embodiment, the first and second resonators are arranged in a merged fashion.

According to another aspect of the embodiment, the material frequency selective limiter circuit further comprises: coupling circuits arranged to partially reflect a signal between ends of the first and second coupling circuits.

According to another aspect of the embodiment, the material frequency selective limiter circuit further comprises a LC filter arranged between one of the first or second coupling circuits and the first and second resonator, and configured to cancel a signal at one half of the fundamental frequency.

According to another aspect of the embodiment, the first resonator and second resonator comprise distributed components.

According to another aspect of the embodiment, the distributed components comprise segments of transmission lines.

According to another aspect of the embodiment, the first resonator and second resonator comprise a combination of lumped and distributed components.

According to another aspect of the embodiment, the first resonator and second resonator each comprise a plurality of inductors arranged in series, each inductor arranged between ground and a node of series components, and a plurality of capacitors, each capacitor arranged between ground and a respective node between adjacent of the inductors.

According to another aspect of the embodiment, the non-linear coupling component comprises at least one varactor diode.

According to another aspect of the embodiment, the non-linear coupling component comprises a plurality of varactor diodes.

According to another aspect of the embodiment, the at least one varactor diode comprises a single varactor diode arranged as a single shunt diode arranged between ground and the first and second resonators.

According to another aspect of the embodiment, the at least one varactor diode comprises three varactor diodes arranged in a three shunt diode arrangement, each of the shunt diodes arranged between ground and the first and second resonators.

According to another aspect of the embodiment, the at least one varactor diode comprises a single varactor diode arranged as a single series diode arranged in series with the first and second resonators.

According to another aspect of the embodiment, the at least one varactor diode comprises three varactor diodes arranged in a three series diode arrangement, each of the series diodes arranged in series with the first and second resonators.

According to another aspect of the embodiment, the at least one varactor diode comprises three varactor diode pairs arranged in a three back-to-back diodes arrangement, each back-to-back diode pair arranged in series with the first and second resonators.

According to another aspect of the embodiment, the at least one varactor diode comprises three varactor diodes arranged in a three shunt diode arrangement, each of the shunt diodes arranged between ground and the first and second resonators, and three varactor diode pairs arranged in a three back-to-back diodes arrangement, each back-to-back diode pair arranged in series with the first and second resonators.

According to another aspect of the embodiment, the at least one varactor diode comprises a single varactor diode arranged as a single shunt diode arranged between ground and the first and second resonators, and a diode pair arranged in a back-to-back arrangement, the diode pair arranged in series with the first and second resonators.

According to another embodiment, there is provided a filter network. The filter network comprises: a first bandpass filter; a second bandpass filter; and a non-magnetic material frequency selective limiter circuit connected to the first and second bandpass filters in parallel, wherein the non-magnetic material frequency selective limiter circuit comprises: an input configured to receive an input signal; an output configured to output an output signal; a first resonator oscillating at a fundamental frequency to pass a signal having a frequency $\omega$ for an input signal having the frequency $\omega$; a second resonator oscillating at one half of the fundamental frequency to pass a signal having a frequency $\omega/2$ for an input signal having the frequency $\omega$; a non-linear coupling component non-linearly an parametrically coupling the first resonator and the second resonator, wherein the first resonator, second resonator and the non-linear coupling component are arranged so as to reduce the amplitude of an output signal for an input signal of frequency $\omega$ when an input signal amplitude is above a voltage threshold value, by converting part of the input signal to a signal at the frequency $\omega/2$, wherein the first resonator, second resonator and the non-linear coupling component are formed of non-magnetic materials.

According to another embodiment, there is provided a signal to noise enhancer circuit. The signal to noise enhancer circuit comprises: a first non-magnetic material frequency selective limiter circuit; an attenuator arranged to receive an output from the first non-magnetic material frequency selective limiter circuit; a second non-magnetic material frequency selective limiter circuit having a different threshold power than the first non-magnetic material frequency selective limiter circuit; a phase shifter arranged to receive an output from the second non-magnetic material frequency selective limiter circuit; a power splitter configured to split a signal power between the first and second non-magnetic material frequency selective limiter circuits; and a power combiner configured to combine the signal powers received from the attenuator and phase shifter, wherein the first and second non-magnetic material frequency selective limiter circuits each comprise: an input configured to receive an input signal; an output configured to output an output signal; a first resonator oscillating at a fundamental frequency to pass a signal having a frequency $\omega$ for an input signal having the frequency $\omega$; a second resonator oscillating at one half of the fundamental frequency to pass a signal having a frequency $\omega/2$ for an input signal having the frequency $\omega$; a non-linear coupling component non-linearly an parametrically coupling the first resonator and the second resonator, wherein the first resonator, second resonator and the non-linear coupling component are arranged so as to reduce the amplitude of an output signal for an input signal of frequency $\omega$ when an input signal amplitude is above a voltage threshold value, by converting part of the input signal to a signal at the frequency $\omega/2$, wherein the first resonator, second resonator and the non-linear coupling component are formed of non-magnetic materials.

BRIEF DESCRIPTION OF THE DRAWINGS

FIG. 1A illustrates a first resonator oscillating at a fundamental frequency $\omega_S$ according to an embodiment.

FIG. 1B illustrates a second resonator oscillating at $\omega_S/2$ according to an embodiment.

FIG. 1C illustrates a non-magnetic material FSL with the first resonator parametrically coupled with the second resonator where the first and second resonators are merged according to an embodiment.

DETAILED DESCRIPTION

The present inventor has realized that the magnetostatic to spin-wave coupling of magnetic material FSLs can be mimicked in non-magnetic material based on parametrically coupled transmission line resonators. In this case, a non-magnetic material based FSL can be provided.

Figure 1D:
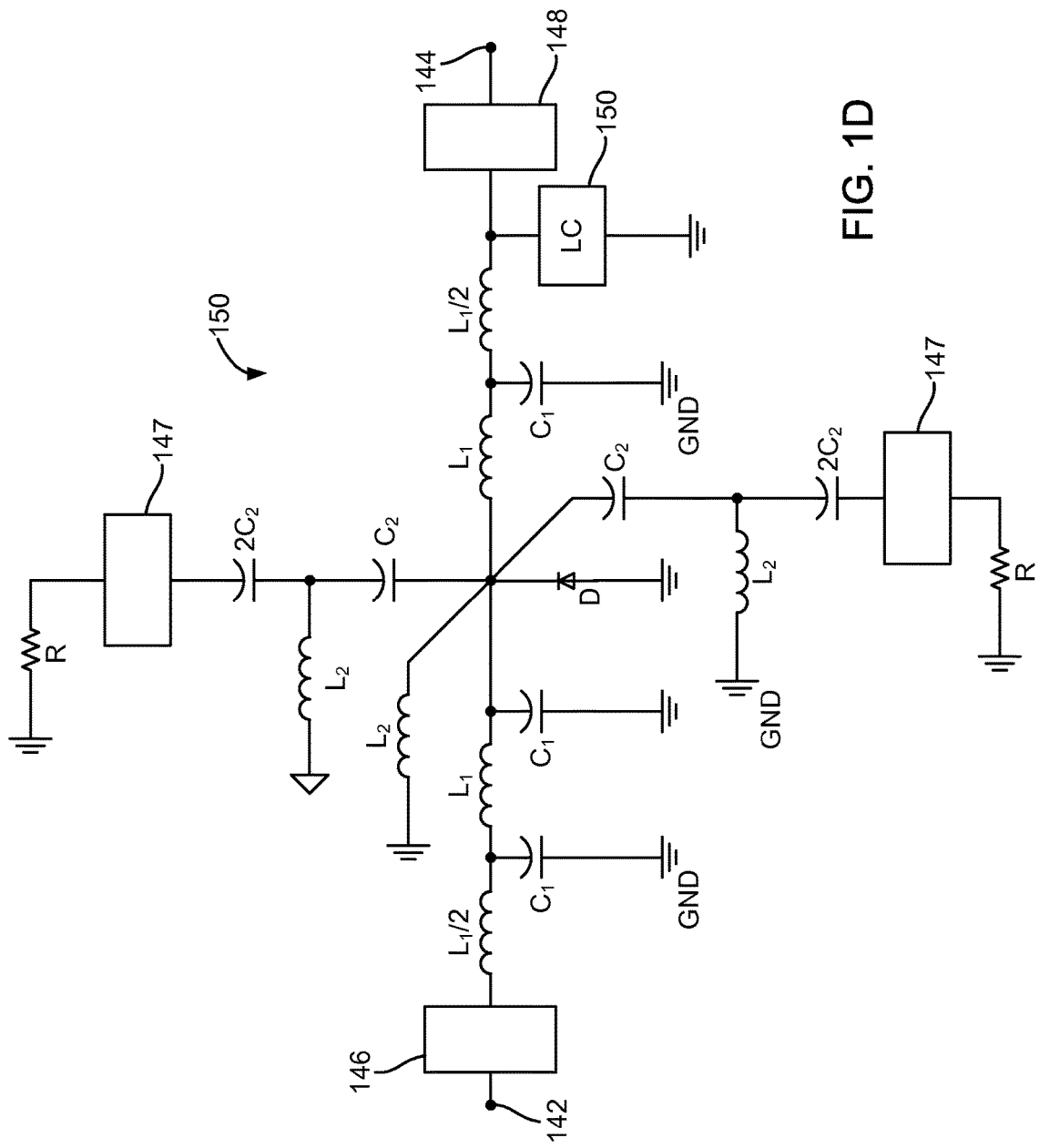
FIG. 1D illustrates a non-magnetic material FSL with the first resonator parametrically coupled with the second resonator according to an embodiment where resonators cross each other.

FIGS. 1A-1C illustrate a non-magnetic material FSL according to an embodiment, where FIG. 1A illustrates a first resonator oscillating at a fundamental frequency $\omega_S$, FIG. 1B illustrates a second resonator oscillating at one half the fundamental frequency $\omega_S$, i.e., at $\omega_S/2$, and FIG. 1C and FIG. 1D illustrate the non-magnetic material FSL with the first resonator parametrically coupled with the second resonator.

Referring to FIG. 1A, the first resonator 110 oscillates at a fundamental frequency $\omega_S$. That is, for a signal with a frequency $\omega$ input to the first resonator 110, an output signal with a frequency $\omega$ is output. The first resonator 110 includes an input 112, which receives an input signal, and an output 114 which provides an output signal. Arranged between the input 112 and the output 114 are a plurality of inductors L1 arranged in series, and a plurality of capacitors C1 arranged between ground GND, and respective nodes between adjacent of the inductors L1.

Referring to FIG. 1B, the second resonator 110 oscillates at a one half the fundamental frequency $\omega_S$. That is, for a signal with a frequency $\omega$ input to the first resonator 110, an output signal with a frequency $\omega/2$ is output. The second resonator 130 includes an input 132, which receives an input signal, and an output 134 which provides an output signal. Arranged between the input 132 and the output 134 are a plurality of capacitors C2 arranged in series, and a plurality of inductors arranged between ground GRD and respective nodes between adjacent of the capacitors C2.

FIG. 1C illustrates the non-magnetic material FSL 140 with the first resonator 110 parametrically coupled with the second resonator 130, where the first resonator 110 and the second resonator 130 are merged with one another. The non-magnetic material FSL 140 has an input 142 and an output 144. Further the non-magnetic material FSL 170 may have coupling circuits 146 and 148 coupled to the input 142 and the output 144, respectively. The coupling circuits 146 and 148 act to partially reflect the signals between the coupling circuits 146 and 148, and thus act as semitransparent RF "mirrors" to the resonating structure of the non-magnetic material FSL 140. The coupling circuits 146 and 148 may each comprise an inductor and capacitor arranged in parallel, for example.

The first and second resonators 110, 130 may be coupled via a nonlinear coupling component, where the nonlinear coupling component may be varactor diodes DA, DB and DC, for example, as shown. The nonlinear coupling component may have less than three diodes, and may include one or more diodes, for example. The varactor diodes DA, DB and DC, are each between ground GND and a respective node, where the respective node is between adjacent of the capacitor C1, capacitor C2, inductor L1 and inductor L2 as can be seen in FIG. 1C.

The first and second resonators 110, 130, which are non-linearly coupled, are merged into one another between the coupling circuits 146 and 148 thus forming a nonlinear Fabry-Perot resonator with two oscillation modes, $\omega_S$ and $\omega_S/2$. The nonlinear coupling between the oscillating modes is achieved by the nonlinear coupling component, such as the varactor diodes DA, DB and DC, shown in FIG. 1C. The coupling circuits 146 and 148 provide a reasonable Q-factor at both the fundamental wave ($\omega_S$) and the parametrically generated half frequency wave ($\omega_S/2$). Thus, the non-magnetic material FSL 140 functions as a Fabry-Perot resonator at both the oscillation modes, $\omega_S$ and $\omega_S/2$.

The non-magnetic material FSL 140 may also include an LC filter 150, which may comprise an inductor and capacitor in series, where the LC filter 150 is connected at one end to one of the coupling circuits 146 and 148 between that coupling circuit and the load, and connected at the other end to ground GND. The LC filter 150 is tuned to cancel the half-frequency wave ($\omega_S/2$), and improves the limiting properties of the non-magnetic material FSL 140. Alternatively, or additionally, the parasitic series resistance of the varactor diodes of the nonlinear coupling component of the non-magnetic material FSL 140 may dissipate the half-frequency wave ($\omega_S/2$).

While FIG. 1C illustrates the same number of capacitors and inductors for each stage of the non-magnetic material FSL 140, i.e, one capacitor and one inductor in each stage of the first and second resonators 110, 130, in general the number of capacitors and inductors may vary from stage to stage.

FIG. 1D illustrates a non-magnetic material FSL 150 with the first resonator 110 parametrically coupled with the second resonator 130, where the first resonator 110 and the second resonator 130 cross each other with the coupling element (diode D) in the center. The same reference numerals are used to described the same elements as in the FSL 140 of FIG. 1C. The non-magnetic material FSL 150 of FIG. 1D further includes coupling circuits 147 as shown.

Resonators of FIG. 1A and FIG. 1B may be complementary in case of the merged arrangement of FIG. 1C, i.e., inductors may be replaced with capacitors and capacitors with inductors. Resonators can be complementary or of the same type in configuration of FIG. 1D. Each resonator may have 3 or more stages. Stages of resonators can be implemented with lumped components or as stages of distributed transmission lines or can be hybrid consisting of both distributed and lumped components. The stages of resonators can be identical (consist of identical lumped and distributed components) or parameters of components may vary from stage to stage.

Figure 2:
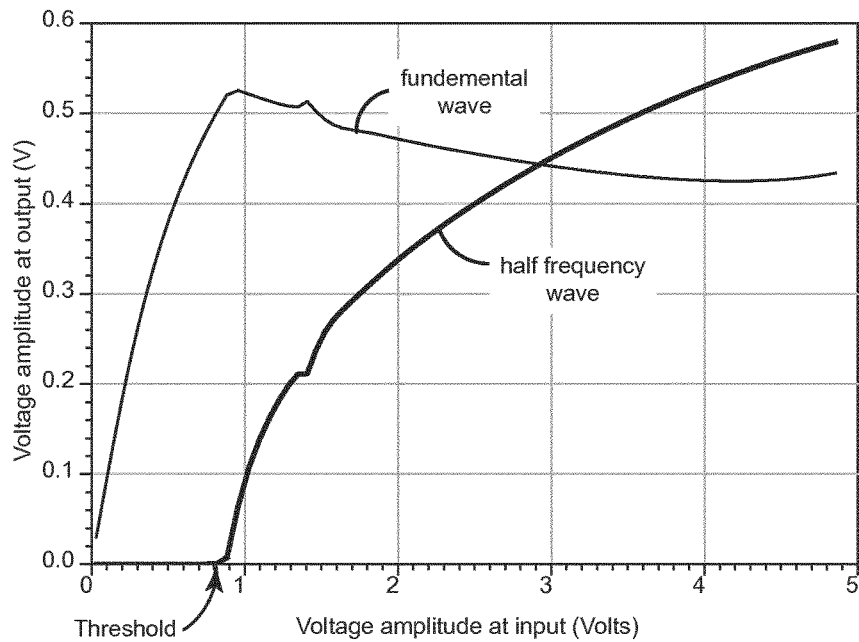
FIG. 2 is a graph illustrating the voltage amplitude at the output as a function of the voltage amplitude at the input for an input signal at a frequency $\omega$ where the threshold is slightly less than 1 volt according to an embodiment.

FIG. 2 is a graph illustrating the amplitude of voltage frequency components at the output 144 as a function of the voltage amplitude at the input 142 for an input signal at a frequency $\omega$ where the threshold is slightly less than 1 volt. FIG. 2 illustrates both the output at the fundamental frequency $\omega$, as well as that at the half frequency $\omega/2$. As can be seen, at the threshold, the amplitude of the half frequency wave increases and limits the amplitude of the fundamental wave.

Figure 3A:
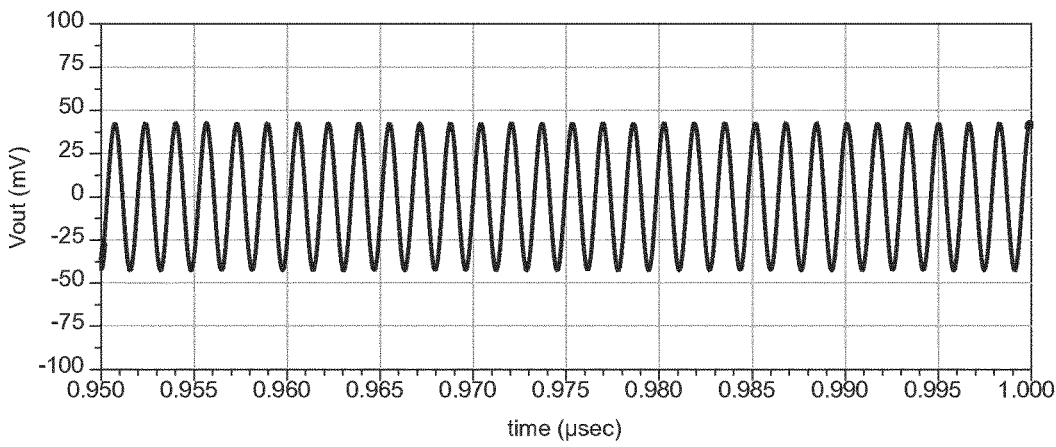
FIG. 3A is a graph illustrating the voltage output as a function of time for a non-magnetic material FSL according to an embodiment, under the condition that the frequency component input has an amplitude below the threshold.
Figure 3B:
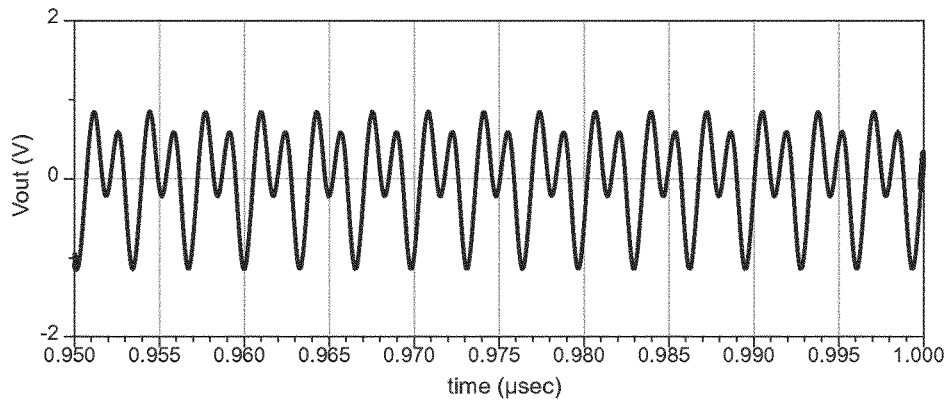
FIG. 3B is a graph illustrating the voltage output as a function of time for a non-magnetic material FSL according to an embodiment, under the condition that the frequency component input has an amplitude above the threshold.

FIGS. 3A and 3B are graphs illustrating the output voltage waveforms as a function of time for the non-magnetic material FSL, for a frequency component having a frequency of 0.6 GHz input to the non-magnetic material FSL. FIG. 3A is for the condition that the frequency component input has an amplitude below the threshold, while FIG. 3B is for the condition that the frequency component input has an amplitude above the threshold. As can be seen in FIG. 3A, for an amplitude below the threshold, the output has only a fundamental wave component at a frequency of 0.6 GHz, while in FIG. 3B both the fundamental wave component at a frequency of 0.6 GHz and the half frequency component at 0.3 GHz are present.

Figure 4A:
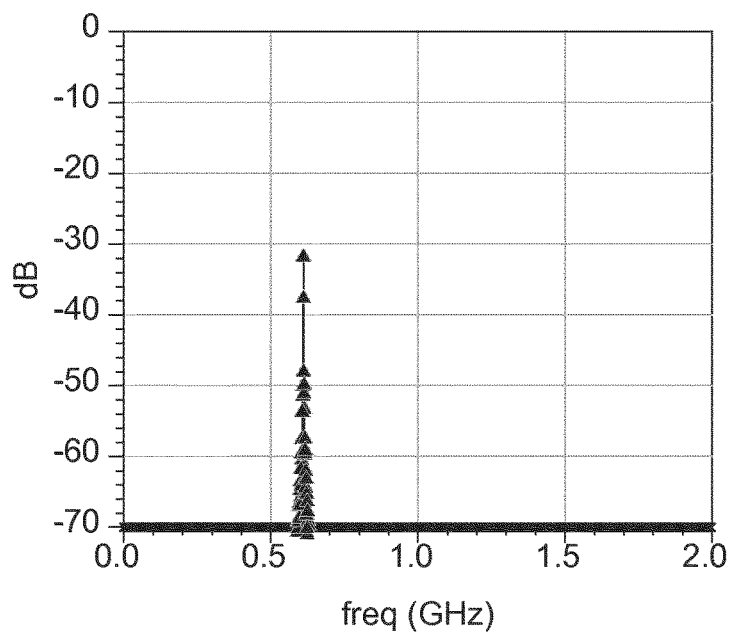
FIG. 4A is a graph illustrating the amplitude of the output frequency components for conditions of FIG. 3A.
Figure 4B:
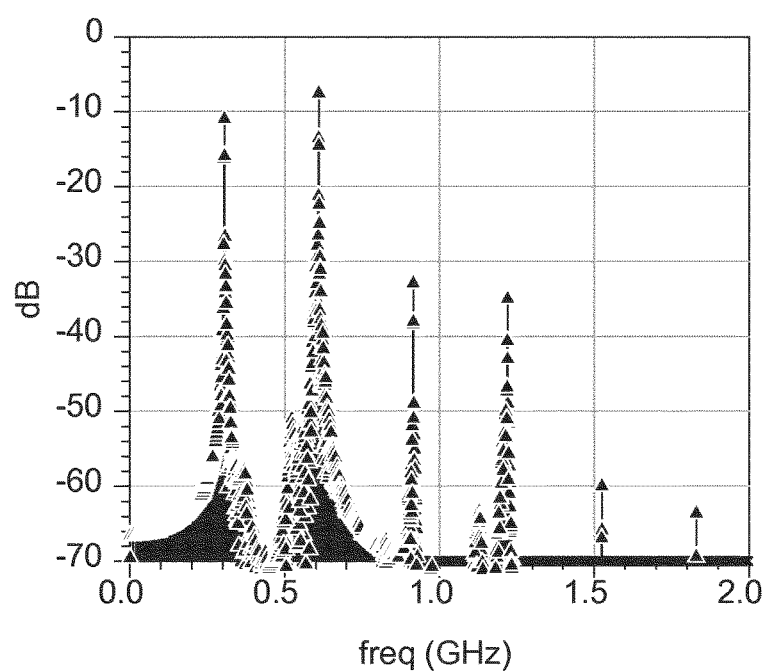
FIG. 4B is a graph illustrating the amplitude of the output frequency components for conditions of FIG. 3B.

FIGS. 4A and 4B illustrate the spectra of voltage waveforms shown in FIGS. 3A and 3B, respectively, that is for the condition that the input frequency component input has an amplitude below and above the threshold, respectively. As can be seen in FIG. 4A only an output frequency component at the fundament frequency of 0.6 GHz is present for an input below the threshold, while in FIG. 4B an output frequency component at both the fundament frequency of 0.6 GHz and at the half frequency of 0.3 GHz are present for an input above the threshold.

In the non-magnetic material FSL both the threshold value and the dynamic range can be controlled by nonlinear properties of the varactor diodes, as well the parameters of the resonator. The nonlinear properties are the C-V characteristics of the varactor diodes.

Figure 5:
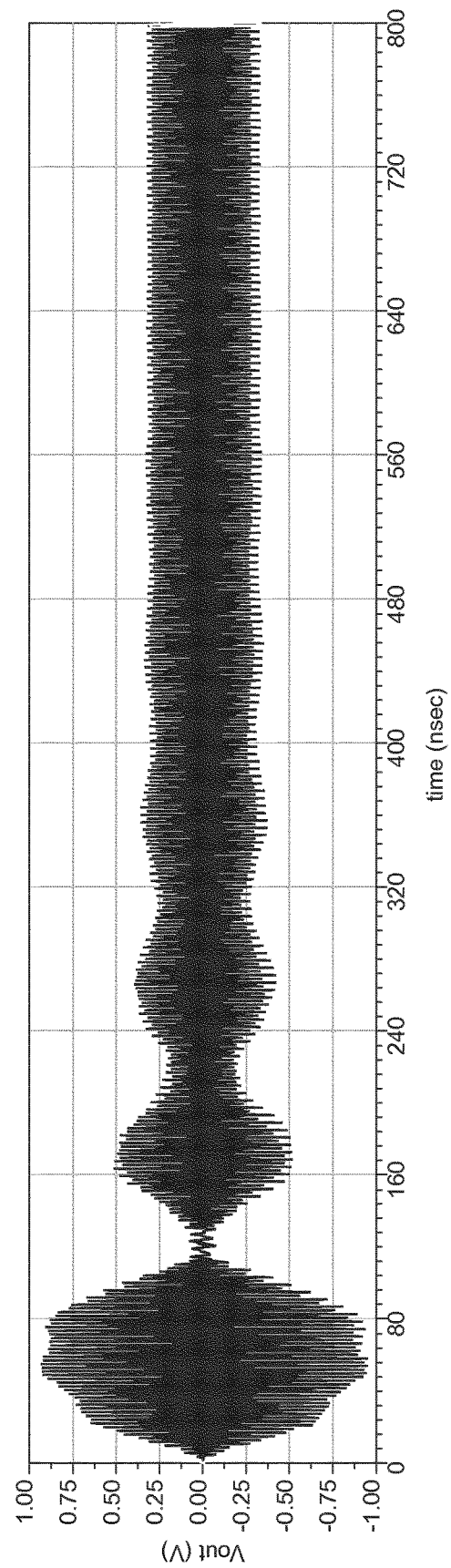
FIG. 5 is a graph illustrating an output voltage of a non-magnetic material FSL according to an embodiment as a function of time from the time the input signal is first applied.

The response time of the non-magnetic material FSL is improved over magnetic material FSL, such as ferrite limiters. FIG. 5 illustrates an output voltage of the non-magnetic material FSL as a function of time from the time the input signal is first applied. As can be seen, the transient process for the non-magnetic material FSL is less than about 200 nano seconds, which is about a 5 fold improvement over ferrite limiters.

Advantages Over Magnetic Material FSL

The non-magnetic material FSL provides a number of advantages over magnetic material FSLs in frequency range, dynamic range, threshold power, leading edge spike (response time), cost, size and integration.

While magnetic material FSLs have a frequency range of 0.2-12 GHz, non-magnetic material FSLs may be designed for a broad range of frequencies from very low frequencies to THz frequencies based on an appropriate choice of nonlinear materials for the varactor diodes of the nonlinear coupling component. For the same reason, non-magnetic FSLs offer unbeatable flexibility in adjusting the threshold power level and dynamic range.

Further, because electronic linearity is generally faster than magnetic nonlinearity, non-magnetic material FSLs may have a response time shorter than magnetic material FSLs. Proof-of-principle simulations demonstrate up to 5× improvement in the response time.

Further, non-magnetic material FSLs are compatible with Monolithic Microwave Integrated Circuits (MMICs), and thus may be readily integrated, and have a small size and cost. By contrast magnetic material FSLs generally are relatively expensive specialized components, bulky, and not compatible with IC technology.

The approach described herein offers the same functionality as magnetic FSLs functionality in terms of frequency selectivity for narrowband source interferers. The approach also offers low-noise performance as it relies on reactive components only. This is in contrast to other diode-based limiter solutions relying on resistive (dissipative) properties of the diodes.

Specific Circuit Designs

Figure 6:
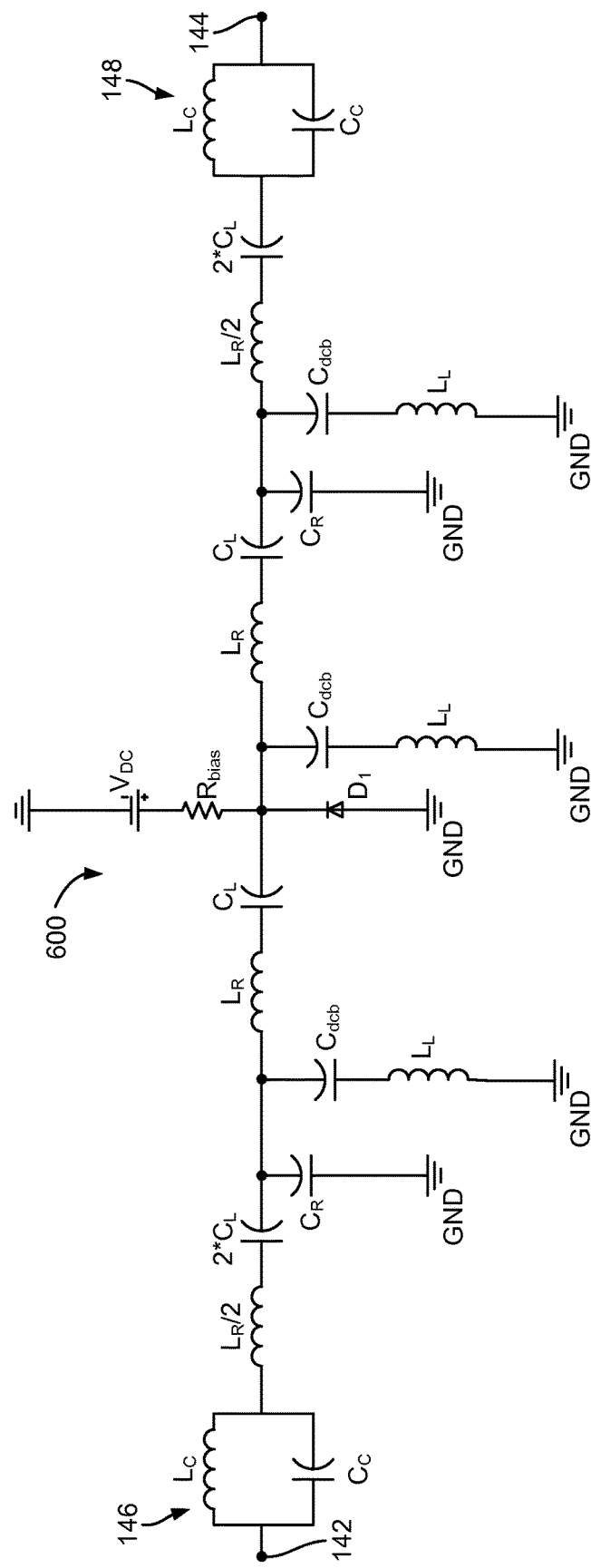
FIG. 6 is a circuit diagram illustrating a non-magnetic material FSL having a single shunt diode arrangement according to an embodiment.

FIG. 6 illustrates a non-magnetic material FSL 600 having a single shunt diode arrangement. The FSL 600 has an input 142, output 144, coupling circuits 146 and 148 in a similar manner to the arrangement for the non-magnetic material FSL 170 of FIG. 1C.

The coupling circuits 146 and 148 may each include an inductor $L_C$ and a capacitor $C_C$ arranged in series.

The first resonator, oscillating at a fundamental frequency $\omega_S$, includes the inductors $L_R/2$, $L_R$, and the capacitors $C_R$, while the second resonator, oscillating at one half the fundamental frequency $\omega_S/2$, includes inductors $L_L$, and the capacitors $C_L$ and $2*C_L$. The DC block capacitor, $C_{dcb}$, is arranged to block direct current where one end of an adjacent inductors $L_L$ is connected to ground GND, and the other end to the block capacitor, $C_{dcb}$.

The load is connected to a voltage $V_{Dc}$ via a bias resistor $R_{bias}$. The single shunt diode D1, functioning as the nonlinear coupling component, couples the first and second resonators. The single shunt diode D1 is connected to the ground GND at one end, and to the bias resistor $R_{bias}$ and first and second resonators at the other end.

The single shunt diode arrangement of FIG. 6 has an advantage over a multi diode arrangement in reducing self-biasing where the half frequency wave goes out of synchronism at higher amplitude voltage inputs.

Figure 7:
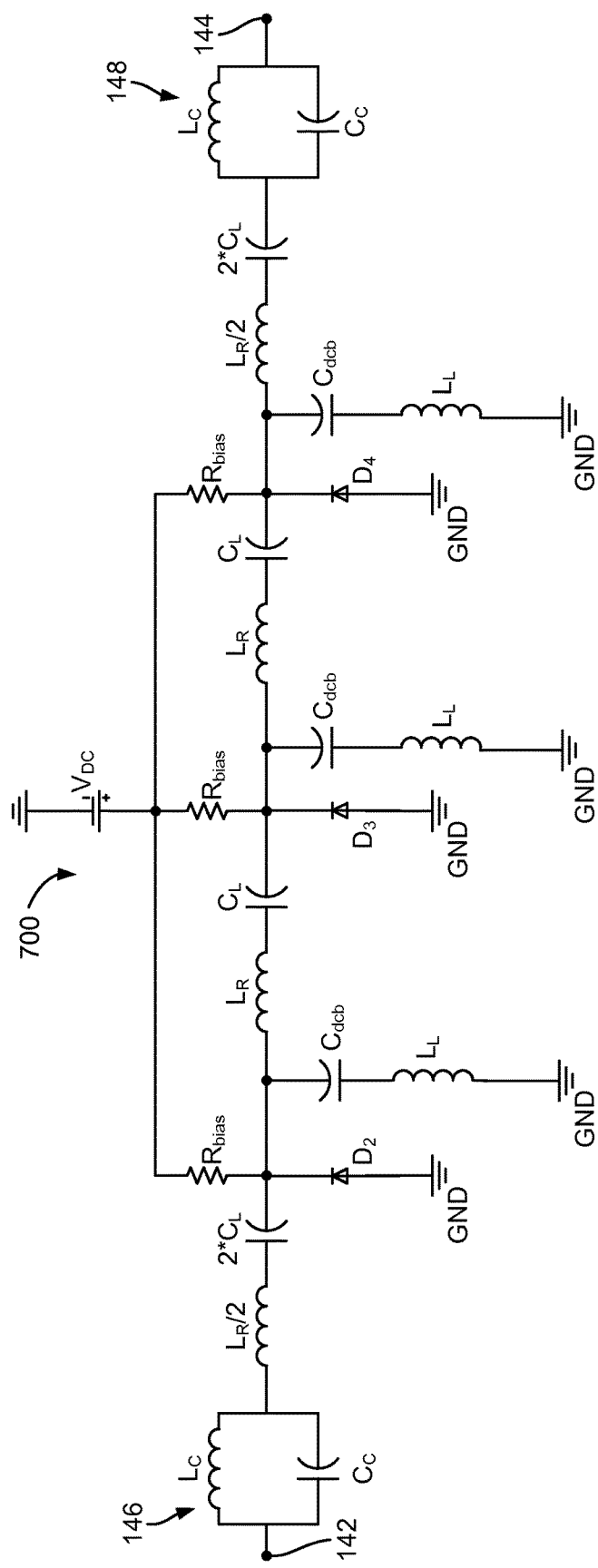
FIG. 7 is a circuit diagram illustrating a non-magnetic material FSL having a three shunt diodes arrangement according to an embodiment.

FIG. 7 illustrates a non-magnetic material FSL 700 having a three shunt diodes arrangement. In the three shunt diodes arrangement of FIG. 7, the single shunt diode D1 of the FIG. 6 arrangement is replaced with the three shunt diodes D2, D3 and D4. The three shunt diodes D2, D3 and D4, functioning as the nonlinear coupling component, couple the first and second resonators. The three shunt diodes D2, D3 and D4 are connected to the ground GND at one end, and to a respective of the bias resistors $R_{bias}$ and to the first and second resonators at the other end.

The three diode arrangement of FIG. 7 has an advantage over a single diode arrangement in providing better dissipation of the half frequency wave.

Figure 8:
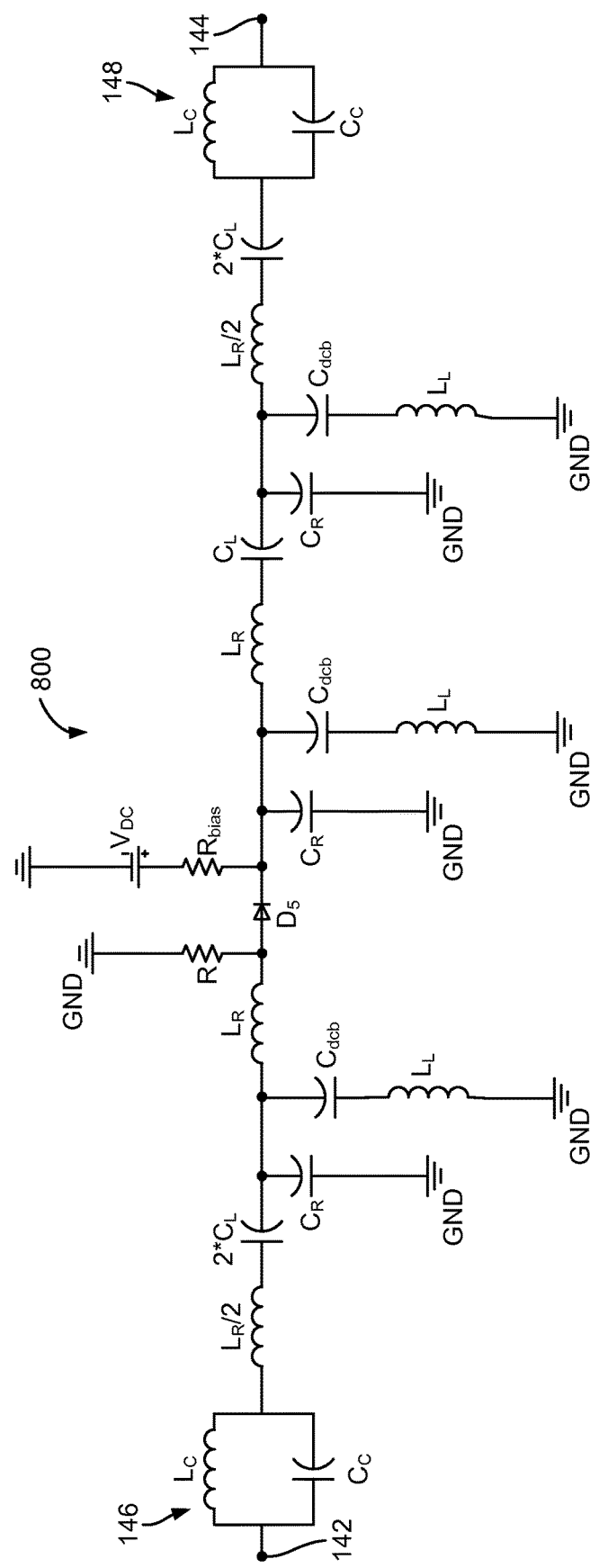
FIG. 8 is a circuit diagram illustrating a non-magnetic material FSL having a single series diode arrangement according to an embodiment.

FIG. 8 illustrates a non-magnetic material FSL 800 having a single series diode arrangement. In the single series diode arrangement of FIG. 8, the single shunt diode D1 of the FIG. 6 arrangement is replaced with the single series diode D5. The single series diode D5, functioning as the nonlinear coupling component, couples the first and second resonators in a series fashion. The single series diode D5 is connected to the first and second resonators in a series fashion.

Figure 9:
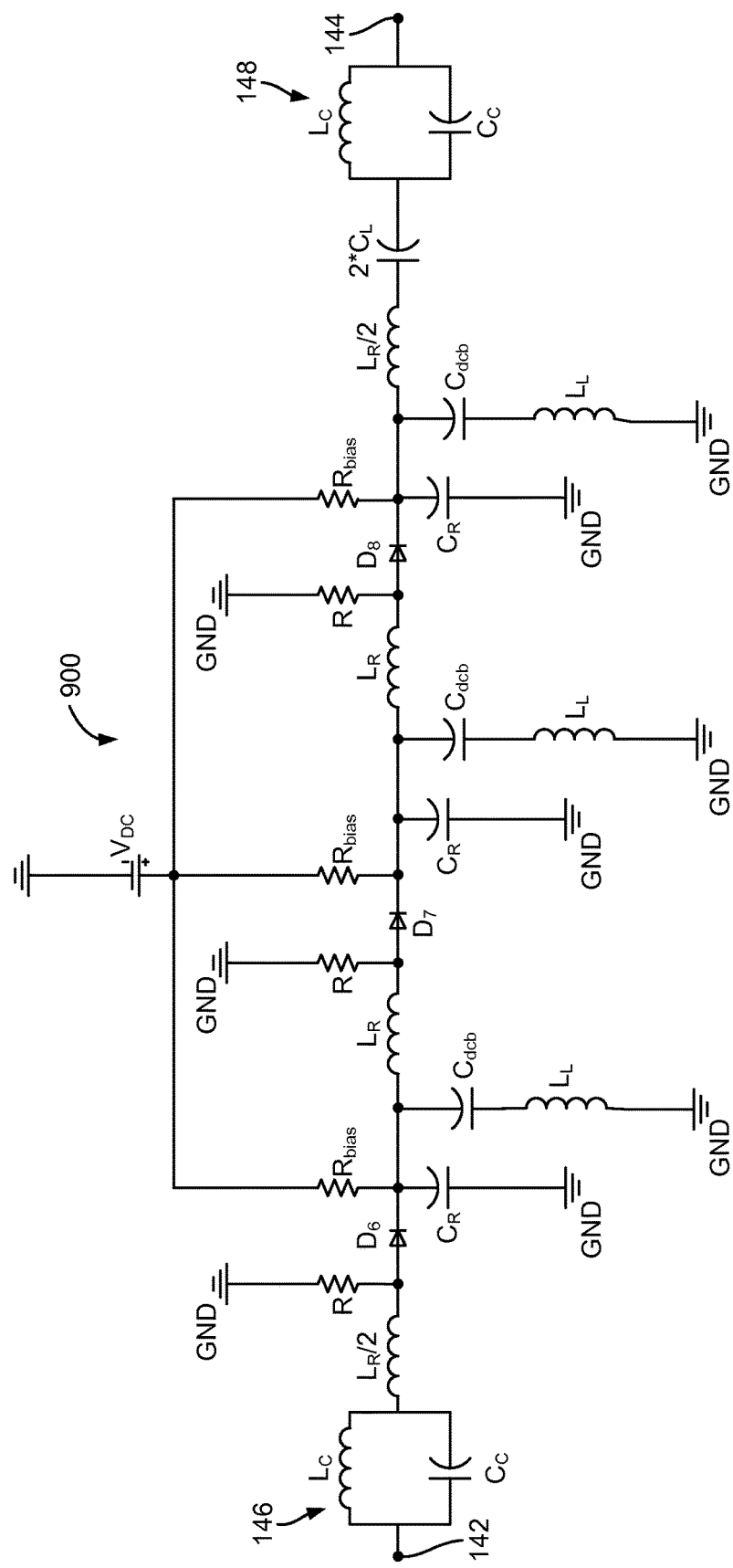
FIG. 9 is a circuit diagram illustrating a non-magnetic material FSL having a three series diodes arrangement according to an embodiment.

FIG. 9 illustrates a non-magnetic material FSL 900 having a three series diodes arrangement. In the three series diodes arrangement of FIG. 9, the single diode D5 of the FIG. 8 arrangement is replaced with the three series diodes D6, D7 and D8. The three series diodes D6, D7 and D8, functioning as the nonlinear coupling component, couple the first and second resonators in a series fashion. The three series diodes D6, D7 and D8 are connected to the first and second resonators in a series fashion.

Figure 10:
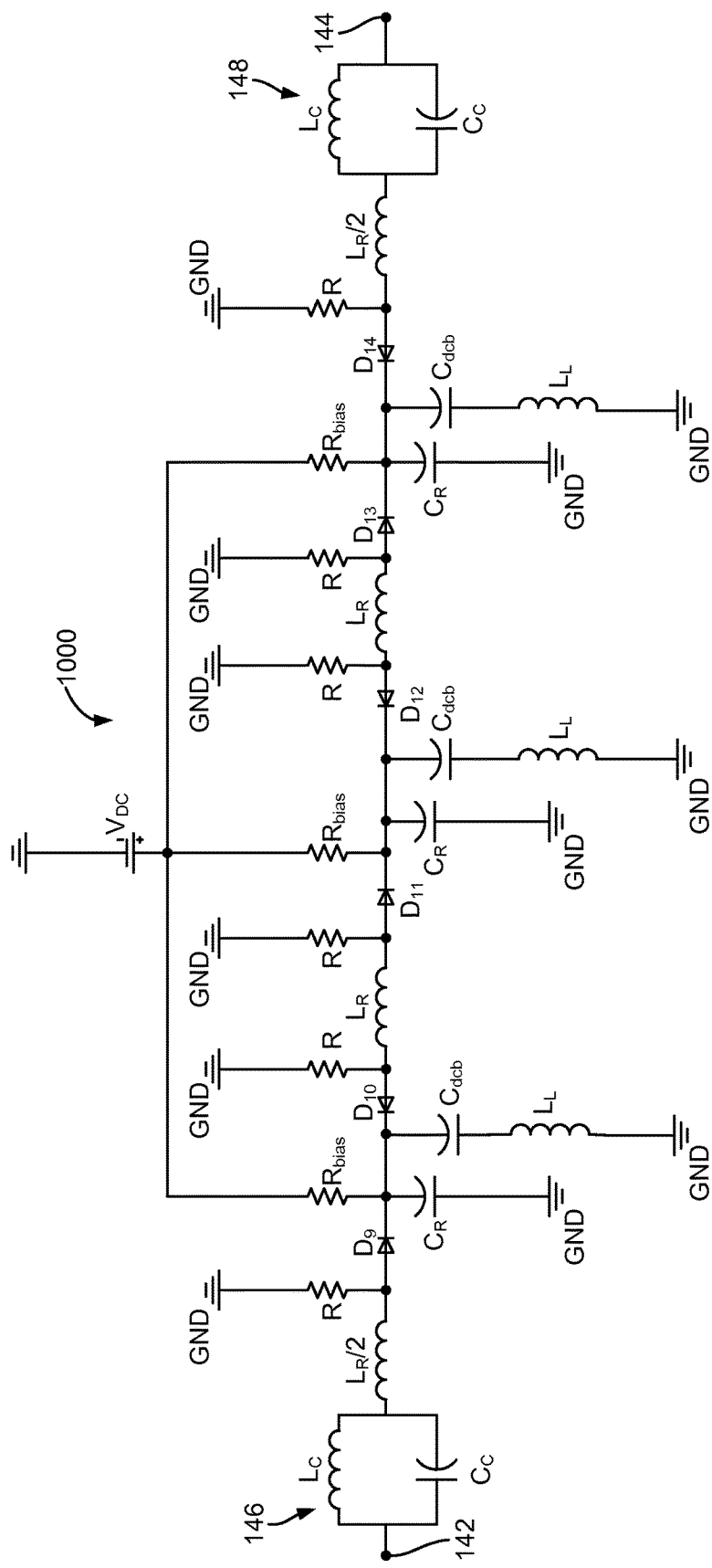
FIG. 10 is a circuit diagram illustrating a non-magnetic material FSL having a three back-to-back diodes arrangement according to an embodiment.

FIG. 10 illustrates a non-magnetic material FSL 1000 having a three back-to-back diodes arrangement. In the three back-to-back diodes arrangement of FIG. 10, each of the three series diodes D6, D7 and D8 of the FIG. 9 arrangement is replaced with a pair of back-to-back diodes. In particular, D6 is replaced with the back-to-back diode pair D9 and D10, D7 is replaced with the back-to-back diode pair D11 and D12, and D8 is replaced with the back-to-back diode pair D13 and D14. The three back-to-back diodes D9, D10, D11, D12, D13 and D14, function as the nonlinear coupling component, couple the first and second resonators in a series fashion. The three back-to-back diodes D9, D10, D11, D12, D13 and D14 are connected to the first and second resonators in a series fashion.

Figure 11:
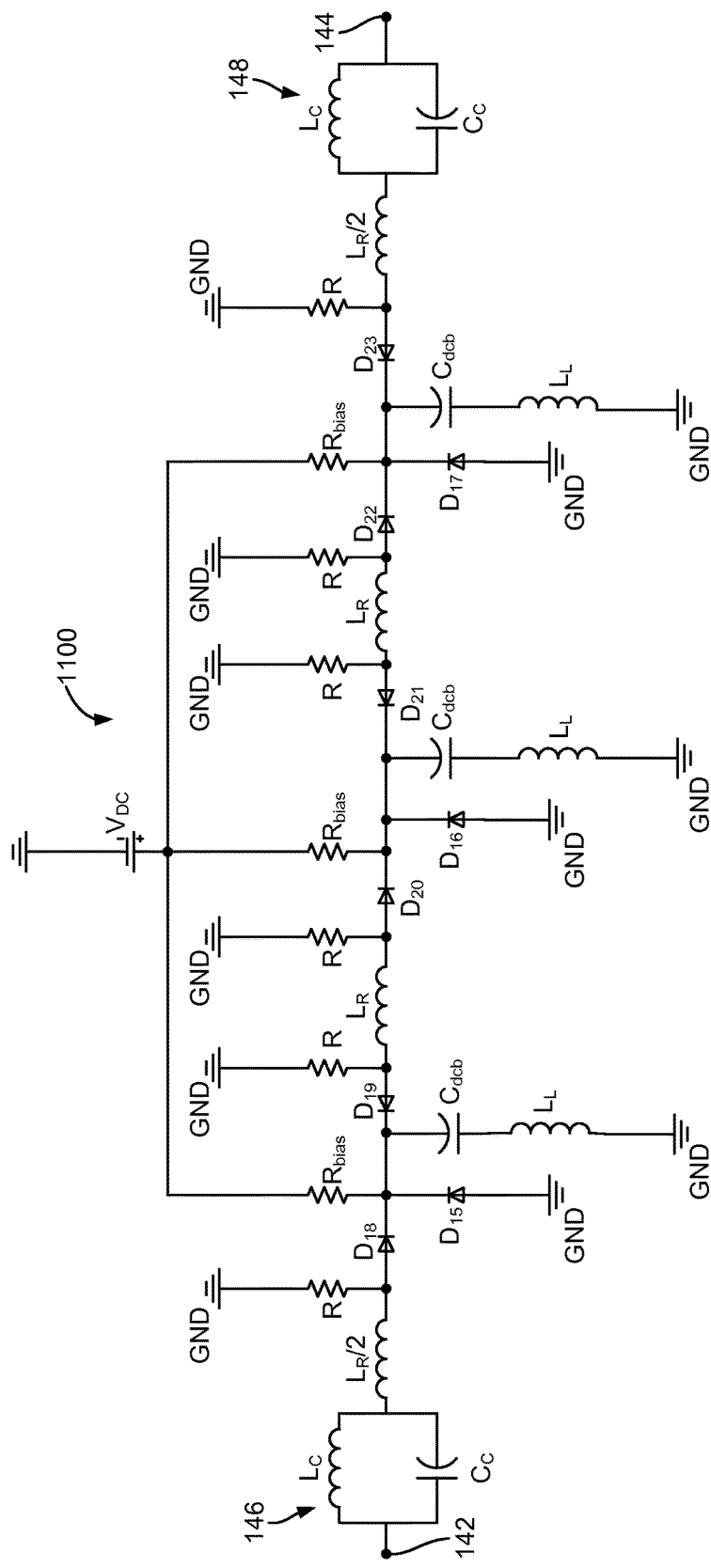
FIG. 11 is a circuit diagram illustrating a non-magnetic material FSL having a combination of a three back-to-back diodes and three shunt diodes arrangement according to an embodiment.

FIG. 11 illustrates a non-magnetic material FSL 1100 having a combination of a three back-to-back diodes arrangement similar to that in FIG. 10, and a three shunt diodes arrangement of that of FIG. 7. In particular, the diode arrangement of the non-magnetic material FSL 1100 has the three diodes D15, D16 and D17 arranged in a three shunt diodes arrangement, while the diodes D18, D19, D20, D21, D22 and D23 are arranged as three back-to-back diode pairs, D18 and D19, D20 and D21, and D22 and D23. The diodes D15, D16, D17, D18, D19, D20, D21, D22 and D23 function as the nonlinear coupling component, couple the first and second resonators. The three back-to-back diodes D18, D19, D20, D21, D22 and D23 are connected to the first and second resonators in a series fashion in a similar fashion to the FSL 1000 of FIG. 10.

Figure 12:
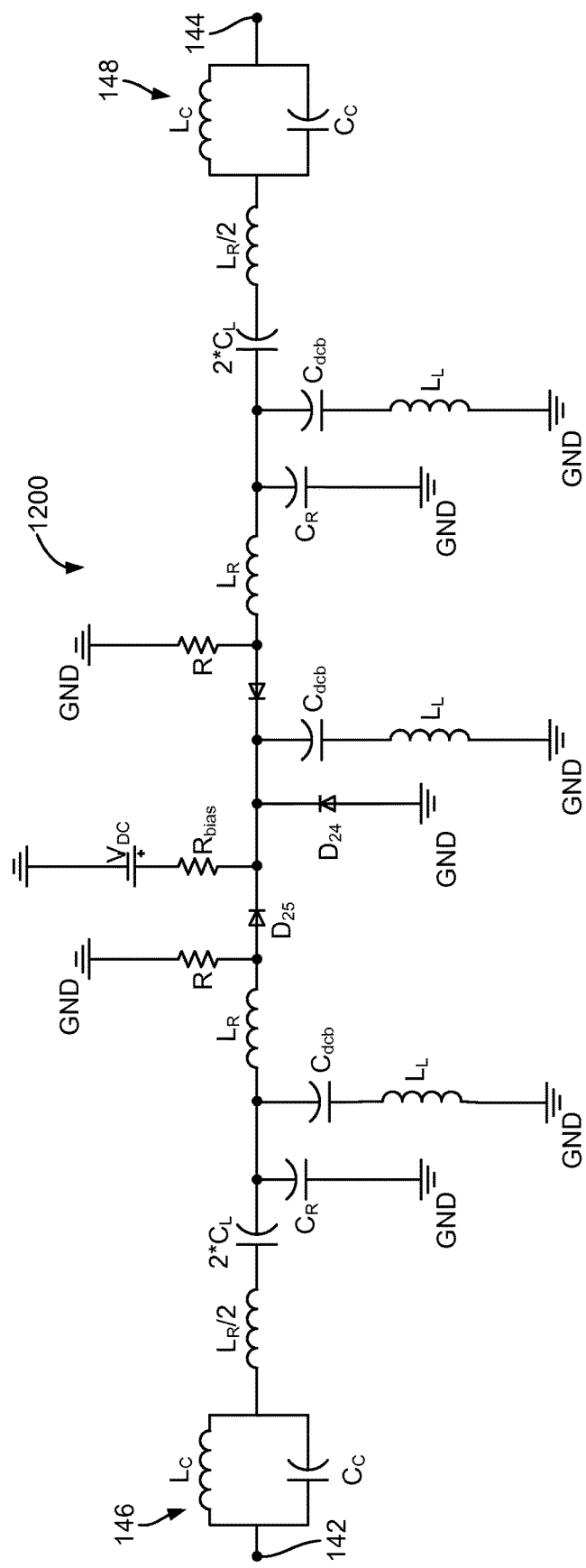
FIG. 12 is a circuit diagram illustrating a non-magnetic material FSL having a combination of a single series back-to-back diode and single shunt diode arrangement according to an embodiment.
Figure 13A:
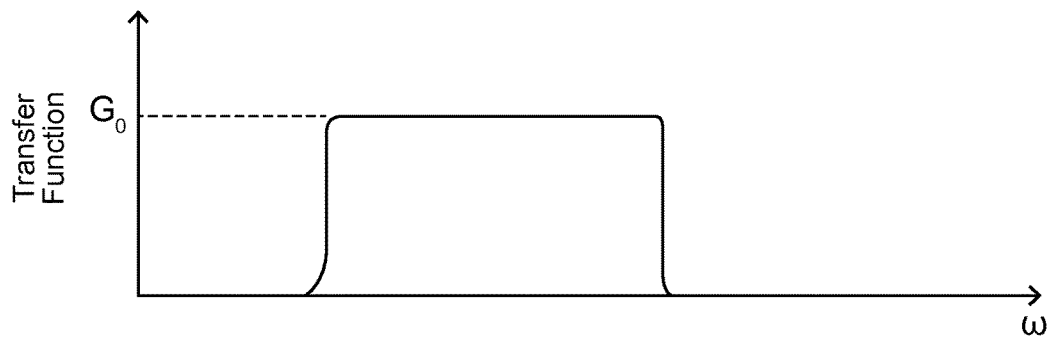
FIG. 13A is a graph illustrating a transfer function of a magnetic material FSL at powers below the threshold power.
Figure 13B:
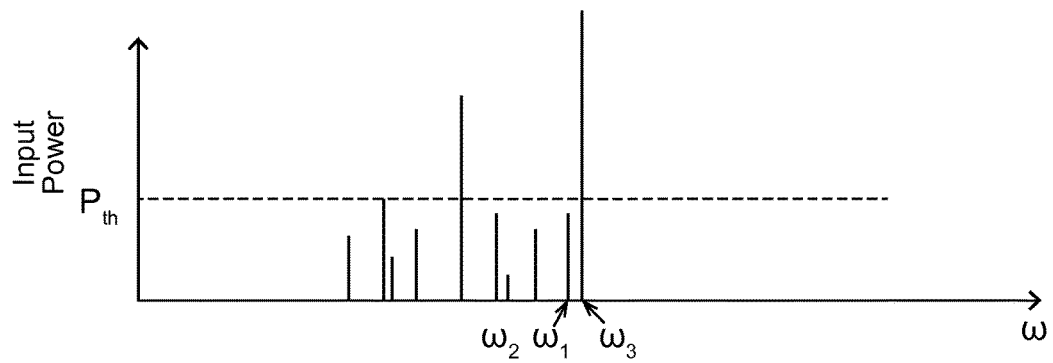
FIG. 13B is a graph illustrating the input powers of various frequency components of a signal for a magnetic material FSL.
Figure 13C:
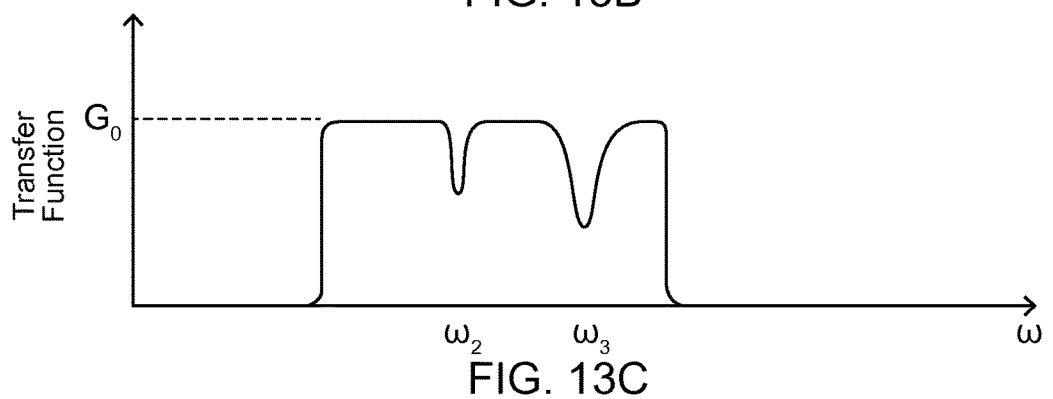
FIG. 13C is a graph illustrating a transfer function of a magnetic material FSL for the input powers of FIG. 13B.
Figure 13D:
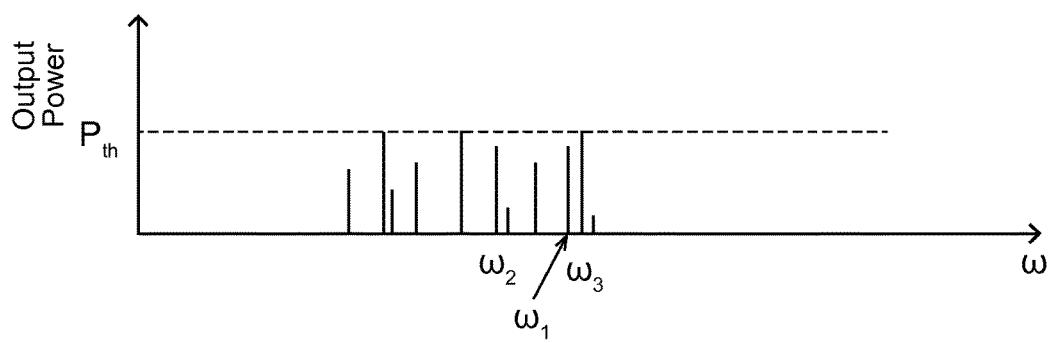
FIG. 13D is a graph illustrating the output powers of a magnetic material FSL for the input powers of FIG. 13B.

FIG. 12 illustrates a non-magnetic material FSL 1200 having a combination of a single series back-to-back diode arrangement, and a single shunt diode arrangement similar to that of FIG. 6. In particular, the diode arrangement of the non-magnetic material FSL 1200 has a single shunt diode arrangement with shunt diode D24, while the diodes D25 and D26 are arranged as a single back-to-back diode pair. The diodes D24, D25 and D26 function as the nonlinear coupling component, couple the first and second resonators. The single back-to-back diode pair D25 and D26 are connected to the first and second resonators in a series fashion.

Figure 14:
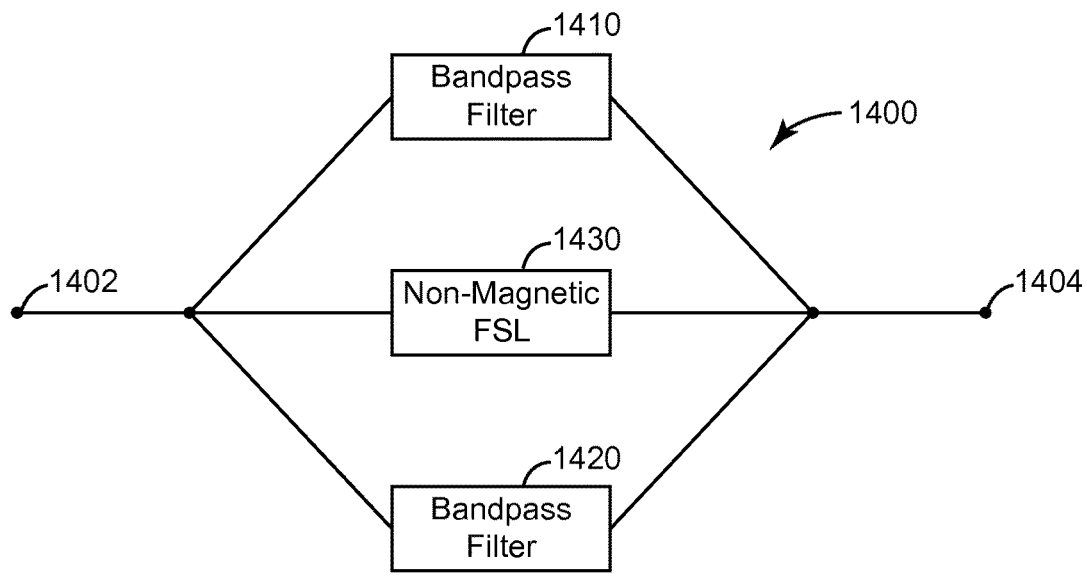
FIG. 14 illustrates a parallel connected filter network with a non-magnetic FSL according to an embodiment.

FIG. 14 illustrates a parallel connected filter network 1400 according to an embodiment of the invention. The filter network 1400 includes a first bandpass filter 1410, a second bandpass filter 1420, and one or more non-magnetic material frequency selective limiter circuits 1430. The first bandpass filter 1410, second bandpass filter 1420, and non-magnetic material frequency selective limiter circuit 1430 are connected in parallel between the input 1402 and output 1404 of the filter network 1400. The non-magnetic material frequency selective limiter circuit 1430 may be any one of the circuits shown in FIGS. 1C, 1D and 6-12, for example.

The passband for the components may be chosen such that the first bandpass filter 1410 has a passband of between frequencies $f_1$ and $f_2$, the non-magnetic material frequency selective limiter circuit 1430 has a passband of between frequencies $f_2$ and $f_3$, and the second bandpass filter 1420 has a passband of between frequencies $f_3$ and $f_4$.

Figure 15:
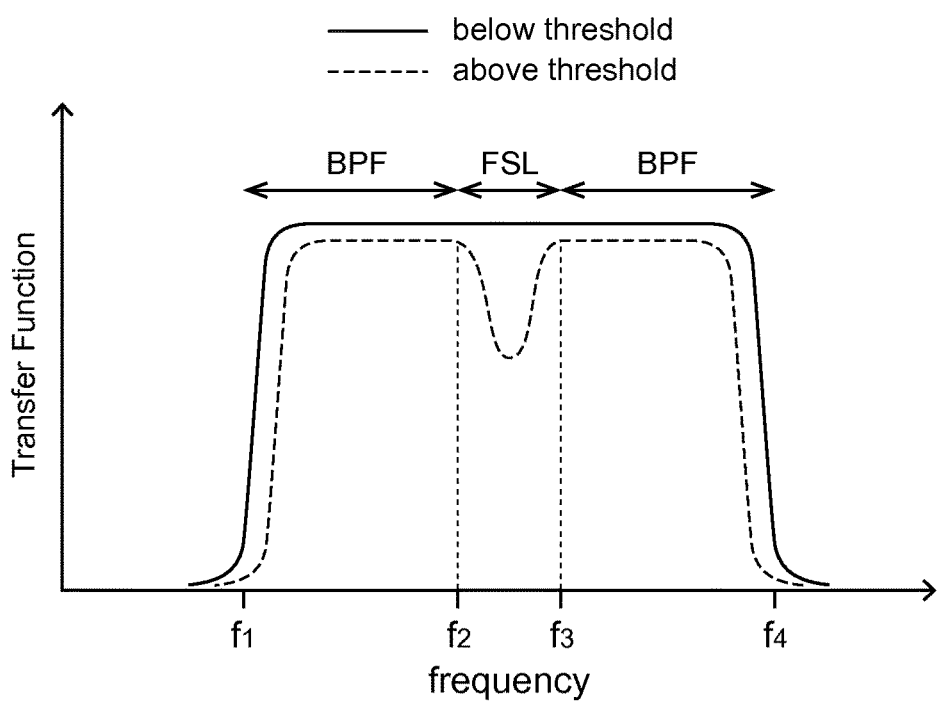
FIG. 15 is a transfer function of the filter network of FIG. 14.

FIG. 15 illustrates a transfer function of the filter network 1400 of FIG. 14. The one or more non-magnetic material frequency selective limiter circuits 1430 arranged in parallel with the bandpass filters 1410 and 1420 allow for a filter network 1400 with a desired signature.

Figure 16:
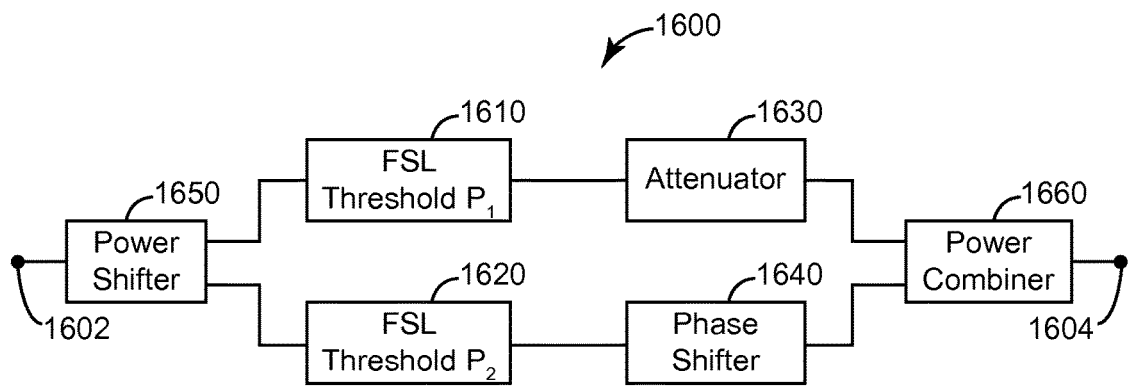
FIG. 16 illustrates signal-to-noise enhancer including two non-magnetic FSL circuits with different threshold levels according to an embodiment.

FIG. 16 illustrates a signal to noise enhancer circuit 1600 according to an embodiment of the invention. The signal to noise enhancer circuit 1600 include two non-magnetic material frequency selective limiter circuits, a first non-magnetic material frequency selective limiter circuit 1610 and a second non-magnetic material frequency selective limiter circuit 1620. The non-magnetic material frequency selective limiter circuits 1610 and 1620 may be any one of the circuits shown in FIGS. 1C, 1D and 6-12, for example.

The signal to noise enhancer circuit 1600 further includes an attenuator 1630 which is in series with, and arranged to receive an output from, the first non-magnetic material frequency selective limiter circuit 1610. The signal to noise enhancer circuit 1600 also includes a phase shifter which is in series with, and arranged to receive an output from, the second non-magnetic material frequency selective limiter circuit 1620.

A power splitter 1650 is arranged to split the signal power from an input 1602 between the first non-magnetic material frequency selective limiter circuit 1610 and the second non-magnetic material frequency selective limiter circuit 1620. A power combiner 1660 is configured to combine the signal powers received from the attenuator 1630 and the phase shifter 1640, and provide the combined signal power to the output 1604.

The second non-magnetic material frequency selective limiter circuit 1620 has a different threshold power than the first non-magnetic material frequency selective limiter circuit 1610. The threshold powers P1 and P2 of the first and second non-magnetic material frequency selective limiter circuits, respectively, may be adjusted by the diode bias voltage.

Figure 17:
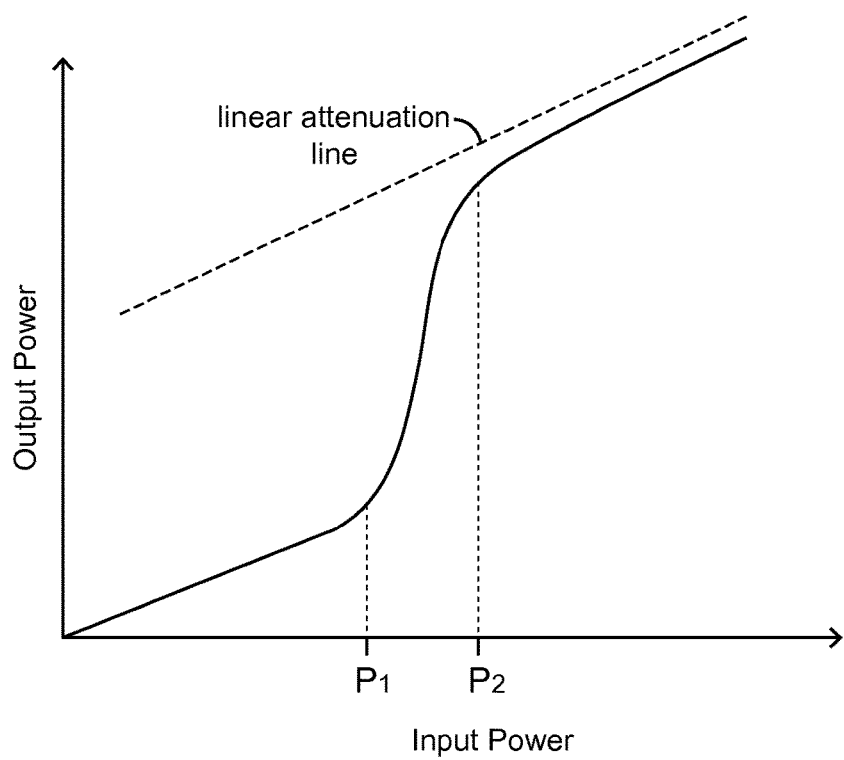
FIG. 17 is a graph illustrating the output power as a function of input power for the signal-to-noise enhancer if FIG. 16.

FIG. 17 is a graph illustrating the output power as a function of input power for the signal-to-noise enhancer of FIG. 16. As can be seen, by adjusting the threshold powers P1 and P2, the shape of the output power curve can be adjusted as desired.

The embodiments of the invention have been described in detail with particular reference to preferred embodiments thereof, but it will be understood by those skilled in the art that variations and modifications can be effected within the spirit and scope of the invention.

What is claimed is:

1. A non-magnetic material frequency selective limiter circuit, comprising:
   an input configured to receive an input signal;
   an output configured to output an output signal;
   a first resonator oscillating at a fundamental frequency to pass a signal having a frequency $\omega$ for an input signal having the frequency $\omega$;
   a second resonator oscillating at one half of the fundamental frequency to pass a signal having a frequency $\omega/2$ for an input signal having the frequency $\omega$;
   a non-linear coupling component non-linearly and parametrically coupling the first resonator and the second resonator,
   wherein the first resonator, second resonator and the non-linear coupling component are arranged so as to reduce the amplitude of an output signal for an input signal of frequency $\omega$ when an input signal amplitude is above a voltage threshold value, by converting part of the input signal to a signal at the frequency $\omega/2$,
   wherein the first resonator, second resonator and the non-linear coupling component are formed of non-magnetic materials,
   wherein the first and second resonators are arranged to cross each other.

2. The non-magnetic material frequency selective limiter circuit of claim 1, further comprising:
   coupling circuits arranged to partially reflect a signal between ends of the non-linearly coupled first and second resonators.

3. The non-magnetic material frequency selective limiter circuit of claim 1, further comprising a LC filter arranged between an end of one of the non-linearly coupled first and second resonators and ground, and configured to cancel a signal at one half of the fundamental frequency.

4. The non-magnetic material frequency selective limiter circuit of claim 1, wherein the first resonator and second resonator comprise distributed components.

5. The non-magnetic material frequency selective limiter circuit of claim 4, wherein the distributed components comprise segments of transmission lines.

6. The non-magnetic material frequency selective limiter circuit of claim 1, wherein the first resonator and second resonator comprise a combination of lumped and distributed components.

7. The non-magnetic material frequency selective limiter circuit of claim 1, wherein the first resonator comprises a plurality of inductors arranged in series, and a plurality of capacitors, each capacitor arranged between ground and a respective node between adjacent of the inductors, and the second resonator comprises a plurality of capacitors arranged in series, and a plurality of inductors, each inductor arranged between ground and a respective node between adjacent of the capacitors.

8. The non-magnetic material frequency selective limiter circuit of claim 1, wherein the non-linear coupling component comprises at least one varactor diode.

9. The non-magnetic material frequency selective limiter circuit of claim 1, wherein the non-linear coupling component comprises a plurality of varactor diodes.

10. The non-magnetic material frequency selective limiter circuit of claim 8, wherein the at least one varactor diode comprises a single varactor diode arranged as a single shunt diode arranged between ground and the first and second resonators.

11. The non-magnetic material frequency selective limiter circuit of claim 8, wherein the at least one varactor diode comprises three varactor diodes arranged in a three shunt diode arrangement, each of the shunt diodes arranged between ground and the first and second resonators.

12. A non-magnetic material frequency selective limiter circuit, comprising:
an input configured to receive an input signal;
an output configured to output an output signal;
a first resonator oscillating at a fundamental frequency to pass a signal having a frequency ω for an input signal having the frequency ω;
a second resonator oscillating at one half of the fundamental frequency to pass a signal having a frequency ω/2 for an input signal having the frequency ω;
a non-linear coupling component non-linearly and parametrically coupling the first resonator and the second resonator,
wherein the first resonator, second resonator and the non-linear coupling component are arranged so as to reduce the amplitude of an output signal for an input signal of frequency ω when an input signal amplitude is above a voltage threshold value, by converting part of the input signal to a signal at the frequency ω/2,
wherein the first resonator, second resonator and the non-linear coupling component are formed of non-magnetic materials,
wherein the non-linear coupling component comprises at least one varactor diode,
wherein the at least one varactor diode comprises three varactor diode pairs arranged in a three back-to-back diodes arrangement, each back-to-back diode pair arranged in series with the first and second resonators.

13. A non-magnetic material frequency selective limiter circuit, comprising:
an input configured to receive an input signal;
an output configured to output an output signal;
a first resonator oscillating at a fundamental frequency to pass a signal having a frequency ω for an input signal having the frequency ω;
a second resonator oscillating at one half of the fundamental frequency to pass a signal having a frequency ω/2 for an input signal having the frequency ω;
a non-linear coupling component non-linearly and parametrically coupling the first resonator and the second resonator,
wherein the first resonator, second resonator and the non-linear coupling component are arranged so as to reduce the amplitude of an output signal for an input signal of frequency ω when an input signal amplitude is above a voltage threshold value, by converting part of the input signal to a signal at the frequency ω/2,
wherein the first resonator, second resonator and the non-linear coupling component are formed of non-magnetic materials, wherein the non-linear coupling component comprises at least one varactor diode,
wherein the at least one varactor diode comprises three varactor diodes arranged in a three shunt diode arrangement, each of the shunt diodes arranged between ground and the first and second resonators, and three varactor diode pairs arranged in a three back-to-back diodes arrangement, each back-to-back diode pair arranged in series with the first and second resonators.

14. A non-magnetic material frequency selective limiter circuit, comprising:
an input configured to receive an input signal;
an output configured to output an output signal;
a first resonator oscillating at a fundamental frequency to pass a signal having a frequency ω for an input signal having the frequency ω;
a second resonator oscillating at one half of the fundamental frequency to pass a signal having a frequency ω/2 for an input signal having the frequency ω;
a non-linear coupling component non-linearly and parametrically coupling the first resonator and the second resonator,
wherein the first resonator, second resonator and the non-linear coupling component are arranged so as to reduce the amplitude of an output signal for an input signal of frequency ω when an input signal amplitude is above a voltage threshold value, by converting part of the input signal to a signal at the frequency ω/2,
wherein the first resonator, second resonator and the non-linear coupling component are formed of non-magnetic materials,
wherein the non-linear coupling component comprises at least one varactor diode,
wherein the at least one varactor diode comprises a single varactor diode arranged as a single shunt diode arranged between ground and the first and second resonators, and a diode pair arranged in a back-to-back arrangement, the diode pair arranged in series with the first and second resonators.

15. A filter network, comprising:
a first bandpass filter;
a second bandpass filter; and
a non-magnetic material frequency selective limiter circuit connected to the first and second bandpass filters in parallel, wherein the non-magnetic material frequency selective limiter circuit comprises:
an input configured to receive an input signal;
an output configured to output an output signal;
a first resonator oscillating at a fundamental frequency to pass a signal having a frequency ω for an input signal having the frequency ω;

a second resonator oscillating at one half of the fundamental frequency to pass a signal having a frequency $\omega/2$ for an input signal having the frequency $\omega$;
a non-linear coupling component non-linearly an parametrically coupling the first resonator and the second resonator,
wherein the first resonator, second resonator and the non-linear coupling component are arranged so as to reduce the amplitude of an output signal for an input signal of frequency $\omega$ when an input signal amplitude is above a voltage threshold value, by converting part of the input signal to a signal at the frequency $\omega/2$,
wherein the first resonator, second resonator and the non-linear coupling component are formed of non-magnetic materials.

* * * * *